(12) United States Patent
Shimada et al.

(10) Patent No.: US 7,919,887 B2
(45) Date of Patent: Apr. 5, 2011

(54) HIGH REPETITOUS PULSE GENERATION AND ENERGY RECOVERY SYSTEM

(75) Inventors: Ryuichi Shimada, Tokyo (JP); Taku Takaku, Tokyo (JP)

(73) Assignee: MERSTech, Inc., Tokyo (JP)

( * ) Notice: Subject to any disclaimer, the term of this patent is extended or adjusted under 35 U.S.C. 154(b) by 164 days.

(21) Appl. No.: 12/388,491

(22) Filed: Feb. 18, 2009

(65) Prior Publication Data

US 2009/0146504 A1     Jun. 11, 2009

Related U.S. Application Data

(63) Continuation of application No. 10/524,893, filed on Feb. 17, 2006, now abandoned.

(51) Int. Cl.
*H03K 3/53* (2006.01)
*H03K 3/57* (2006.01)

(52) U.S. Cl. ......... 307/108; 307/101; 307/106; 307/115

(58) Field of Classification Search ............... 307/101, 307/106, 108, 115
See application file for complete search history.

(56) References Cited

U.S. PATENT DOCUMENTS

| | | | |
|---|---|---|---|
| 4,639,849 A * | 1/1987 | Noworolski et al. | 363/56.05 |
| 4,763,239 A * | 8/1988 | Ball | 363/98 |
| 4,849,873 A | 7/1989 | Vanderhelst | |
| 4,894,765 A | 1/1990 | Kahkipuro | |
| 5,343,377 A * | 8/1994 | Tanaka et al. | 363/17 |
| 6,956,751 B2 | 10/2005 | Youm et al. | |
| 7,269,037 B2 | 9/2007 | Marquardt | |
| 2010/0014333 A1* | 1/2010 | Shimada et al. | 363/126 |

FOREIGN PATENT DOCUMENTS

| | | |
|---|---|---|
| JP | 1985-046778 A | 3/1985 |
| JP | 2619165 B | 3/1997 |
| JP | 326532 B | 12/2001 |
| JP | 3415424 B | 4/2003 |
| JP | 2005-223867 A | 8/2005 |

OTHER PUBLICATIONS

U.S. Appl. No. 11/579,940, co-pending, MERSTech Inc.

* cited by examiner

*Primary Examiner* — Jared J. Fureman
*Assistant Examiner* — Adi Amrany
(74) *Attorney, Agent, or Firm* — International Knowledge Asset Office; Keiji Masaki; Donald Wenskay

(57) ABSTRACT

In order to provide a pulse power supply device using regenerating magnetic energy stored in a discharge circuit to a capacitor so as to use it as next discharge energy and supplying a bipolar pulse current with high repetition, a bridge circuit is composed of four inverse-conductive semiconductor switches, a charged energy source capacitor is connected to a DC terminal of the bridge circuit, and an inductive load is connected to its AC terminal. A control signal is supplied to gates of the inverse-conductive semiconductor switches, and a control is made so that when a discharge current rises, is maintained, or is reduced, all the gates are turned off, and the magnetic energy of the electric current can be automatically regenerated to the energy source capacitor by a diode function of the switches. Further, a large current power supply is inserted into a discharge circuit so as to replenish energy loss due to discharge, thereby enabling high-repetition discharge.

19 Claims, 3 Drawing Sheets

US 7,919,887 B2

HIGH REPETITOUS PULSE GENERATION AND ENERGY RECOVERY SYSTEM

This application is a continuation of co-pending U.S. patent application Ser. No. 10/524,893, filed on Aug. 18, 2003, which is incorporated by reference and priority from which is hereby claimed.

TECHNICAL FIELD

The present invention relates to a pulse power supply device for supplying pulse current to an inductive load.

BACKGROUND ART

When a large electric current is supplied to an inductive load, pulse power supply devices, in which normally an energy source capacitor charged with high voltage is connected to the load by using switches such as an ignitron, a discharge gap switch and a thyristor so that a capacitor discharge is started, are generally used.

In these discharge switches, diodes called clamp circuits are generally connected to loads in parallel or to capacitors in parallel. After the electric current becomes maximum, a capacitor voltage is inverted and simultaneously the diodes are turned on, and the load current reflows to the diodes. As a result, reverse charging of the capacitor is prevented, and the clamped electric current continuously flows while being attenuated with time constant L/R due to electric resistance of the load.

On the other hand, in the applications of the pulse current, frequently rise time is more important than an attenuated waveform. Pulse high-magnetic field bending magnets of compact medical synchrotron accelerators and the like do not use the maximum magnetic field but require an operation such that the magnetic field is raised with time. For this reason, it is demanded that the electric current is attenuated quickly and a pulse rate is heightened. Further, gas excitation laser power supply requires high speed rise of a voltage and high repetition, and thus high repetition control is required as discharge power supply.

In order that the rise of the discharge current is stopped by controlling switches when the discharge current reaches a necessary current value, switches are switched from those only for ON control such as an ignitron, a discharge gap switch and a thyristor to semiconductor switches having self arc-suppressing ability using a gate signal such as a GTO thyristor and an IGBT (Insulated-gate Bipolar Transistor).

An inductive current on the load side, however, is clamped at a voltage of 0, and is only attenuated by the diodes at long time constant L/R in a freewheeling state. The energy is wasted and time to wait for the attenuation is required, thereby raising a technical problem of the pulse power supply devices requiring increased capacity and high repetition.

When the electric current in the freewheeling state is cut off and its magnetic energy can be regenerated to the capacitor, the wasted energy is reduced and further the energy returned to the capacitor is regenerated as next-time energy, so the pulse current generating power supply which has high energy efficiency and high repetition can be realized.

DISCLOSURE OF THE INVENTION

FIG. 2 is a diagram explaining a basic operation of the present invention. A power supply side has a constitution of a current switch of a snubber energy regenerating system. A capacitor which temporarily stores snubber energy corresponds to an energy source capacitor of the present invention. The current switch of the snubber energy regenerating system is disclosed in Japanese Patent Application Laid-Open No. 2000-358359 "FORWARD AND BACKWARD DIRECTION CURRENT SWITCH FOR REGENERATING SNUBBER ENERGY" (Patent Document 1). The present invention utilizes the constitution of the above-mentioned current switch for regenerating the snubber energy, but the Patent Document 1 describes the current switch for temporarily storing magnetic energy of a breaking current circuit into a snubber capacitor and discharging it into a load at the time of next energizing. On the contrary, the present invention is different from the invention in the Patent Document 1 in that the energy source capacitor is charged with full energy, and the load is driven only by the energy, and further, when the pulse is ended, the magnetic energy remaining in the load is regenerated to the energy source capacitor.

In an example of FIG. 2, a load is an inductive load and is represented by a resistor R and an inductance L. In the case of gas laser, however, the load is a discharge electrode, and in the case of an accelerator bending magnet, the load is a dipole coil which is transformer-coupled. In both cases, the load is regarded as a load where L and R are connected in series. When the time of a discharge pulse is sufficiently shorter than the time constant L/R, the energy is mostly supplied by magnetic energy of the inductance.

An operating sequence of FIG. 2 is explained with reference to FIG. 3. Firstly a capacitor 1 is charged so as to have polarity of FIG. 2 (a charging circuit is not shown), and when switches S1 and S2 are turned on, electric charges of the capacitor start to flow to the load. When an electric current becomes maximum and the voltage of the capacitor is negative (forward-direction voltage of a diode), the load current reflows via the diode and is brought into a freewheeling state, and the load current continues to flow in two parallel lines in a direction where "a path where a main current flows" is written. The characteristics of the switch constitution and the operation are that the electric current in the freewheeling state continuously flows in two parallel lines. As a result, a current carrying capacity of the switches is only half, and thus this example is economical.

When the switches S1 and S2 are turned off, the electric current in the freewheeling state is cut off, and the capacitor 1 is recharged into the same polarity via two diodes. As a result, the electric current is quickly reduced and when it becomes zero, the diodes prevent reverse current, thereby stopping the electric current.

After the switches S1 and S2 are turned on, when any one of the switches S1 and S2 is turned off while the capacitor voltage remains, the load current is brought into the freewheeling state, and the capacitor voltage is maintained. When the switch is turned on again, the electric current starts to rise. The high-speed on/off operation of the switches possibly enables PWM control of the capacitor discharge current. This function cannot be realized by the simple current switches of the snubber regenerating system.

When the switches and the diodes in the constitution of FIG. 2 are used, discharge can be started, maintained and reduced by turning on/off the switches at arbitrary timing. Further, the magnetic energy with the same polarity is regenerated to the capacitor.

FIG. 4 is a principle diagram for developing the present invention in both directions of the electric current.

A difference of this drawing from FIG. 2 is that four units where diodes and switches are connected in parallel are installed in inverse-series and in inverse-parallel as shown in FIG. 4, so that a bidirectional electric current is allowed to flow in the load. The same point is that when the switches are turned off, the magnetic energy is regenerated to the capacitor 1 (as in FIG. 2, the charging circuit is not shown).

In order to change the direction of the electric current to the load, selection from an operating switch group is brought into a "cross state", namely, the switches S1 and S2 are turned on in a current forward direction and the switches S3 and S4 are turned on in a current backward direction. "A pair of the switches are selected in the cross state" means that when the four switches are arranged into a quadrangular shape, two of them positioned on a diagonal line are selected. A rational design is made preferably in a manner that the switches and capacities of the diodes according to a level of the maximum electric current in the forward and backward directions are selected.

FIG. 5 is a diagram illustrating a simulation circuit showing that the energy source capacitor 1 can be replenished with energy by a low-voltage large-current power supply 5 inserted into the discharge circuit, and a waveform as its result. According to the waveform of FIG. 5, the capacitor voltage and the load current rise according to the number of discharges, but this is because when a voltage which is not less than a voltage of a DC resistance is injected from an external power supply, the discharge current rises. When the voltage of the external power supply is increased or decreased in such a manner, the value of the pulse current can be controlled.

Prior to the operation, when a voltage is applied to a circuit by the low-voltage large-current power supply 5, an electric current which is determined by a resistor flows. Since the magnetic energy is regenerated to the capacitor 1 and the capacitor 1 is charged by cutting off the electric current using a current switch, the pulse current for high-speed boot can be obtained only by the low-voltage power supply without preparing a high-voltage power supply for charging the capacitor.

BEST MODE FOR CARRYING OUT THE INVENTION

Figure 1:
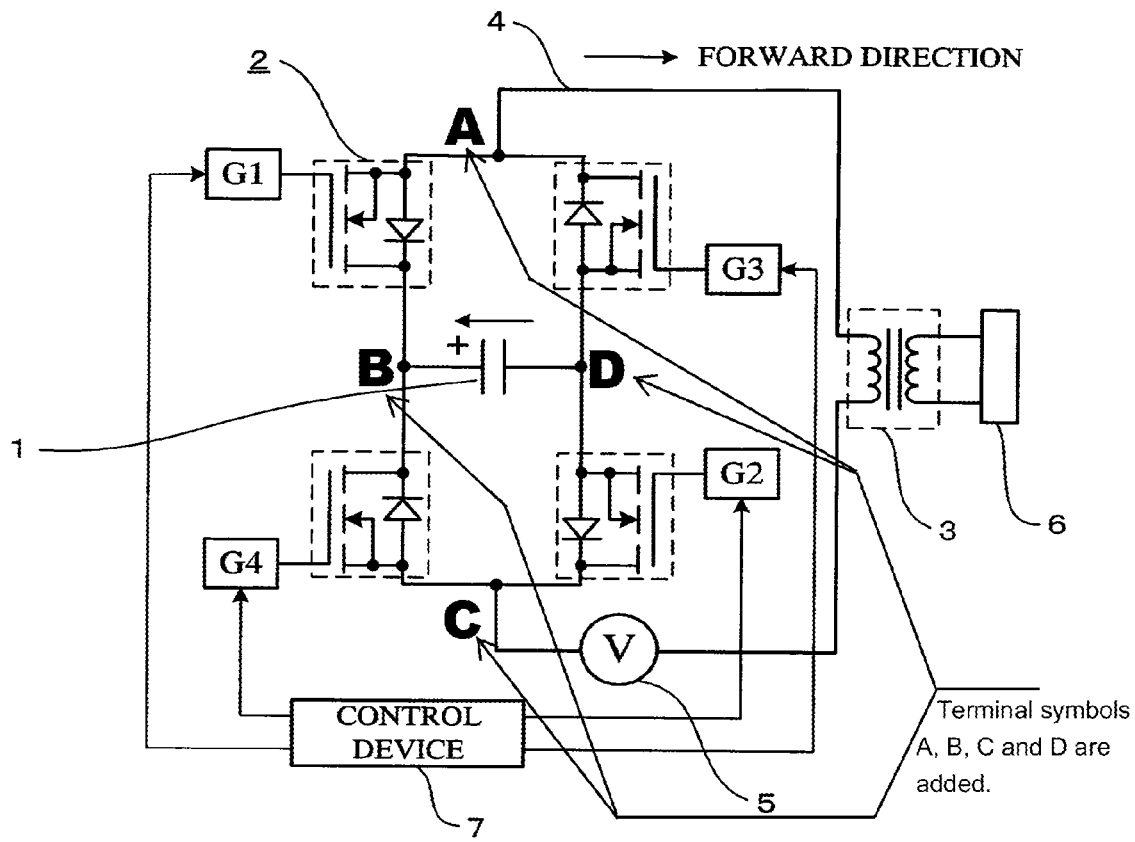
FIG. 1 is a diagram explaining an embodiment of the present invention.
Figure 2:
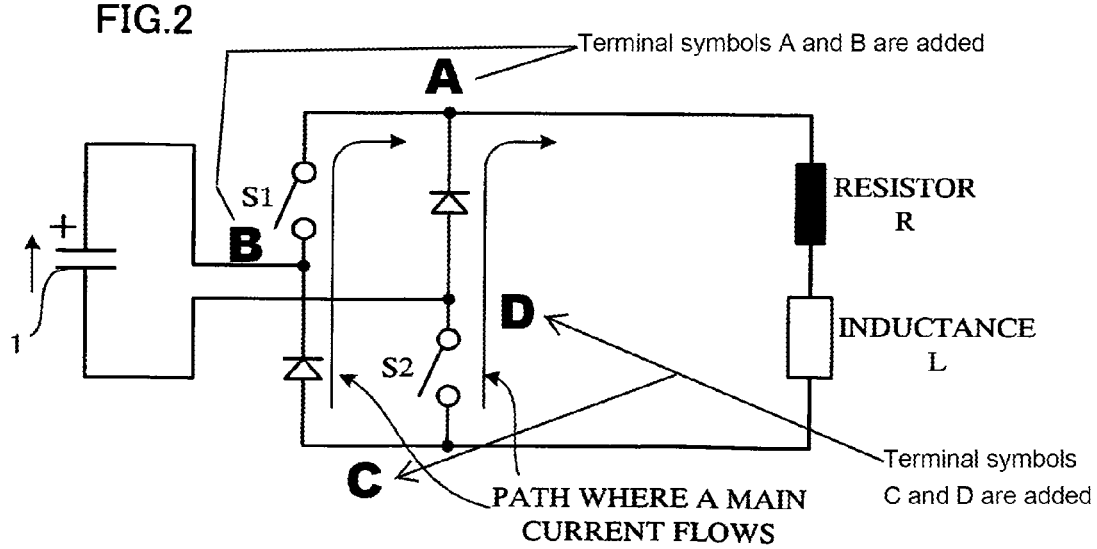
FIG. 2 is a diagram explaining a basic principle of the present invention.
Figure 3:
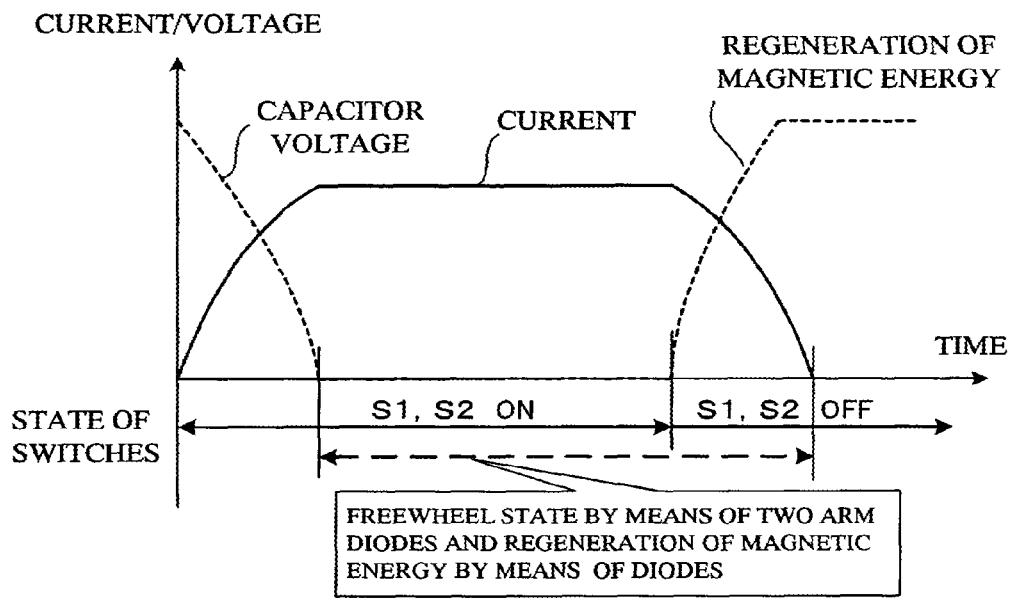
FIG. 3 is a diagram explaining a sequence of an electric current, a voltage and switches in FIG. 2.
Figure 4:
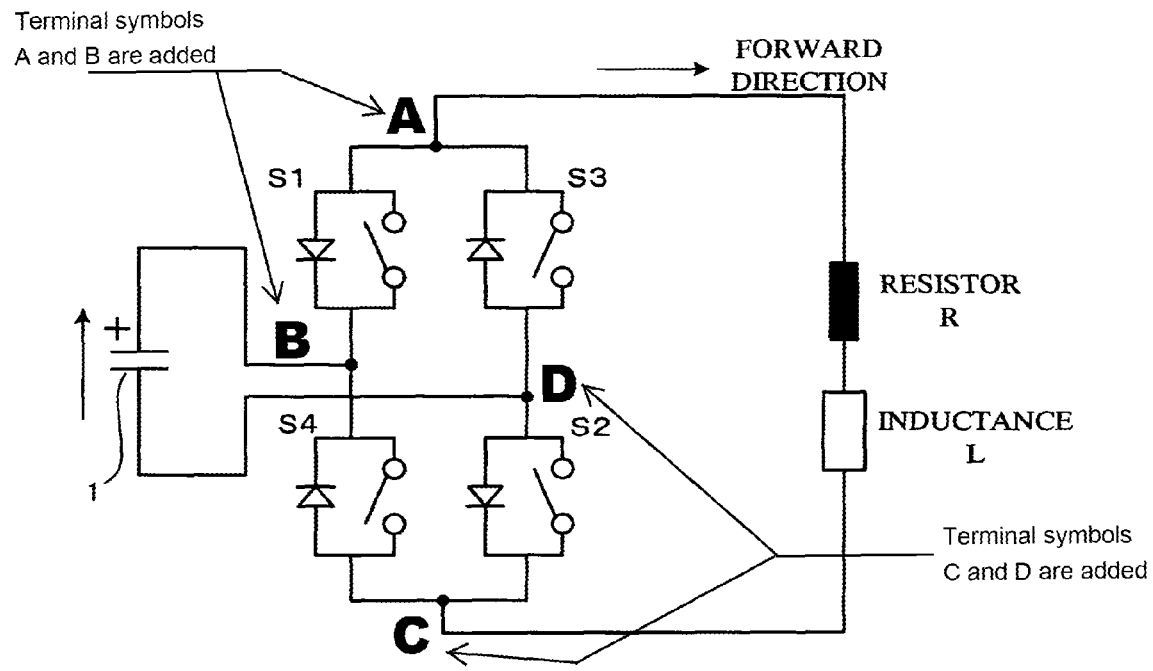
FIG. 4 is a diagram explaining a basic principle of bidirectional current of the present invention.

FIG. 1 is a circuit diagram illustrating an embodiment of the present invention. A difference of FIG. 1 from FIG. 4 is that when an accelerator bending magnet 6 as a concrete example of a load is excited by a pulse current via a current transformer 3, four power MOSFETs are connected in inverse-series and in inverse-parallel. As a result, the four power MOSFETs compose a bridge circuit.

It is assumed that power MOSFETs used here are made of silicon carbide (SiC), and are quickly turned on/off with high withstand voltage, have less conducting loss, and can effectively utilize body diodes (also called parasitic diodes) as a substitution of parallel diodes.

Even when present power MOSFETs made of silicon which cannot practically use body diodes are used, they can be used by forcibly bringing them into an ON state by means of gate control when they are in an inverse conducting state. An inverse conductive type GTO thyristor or a unit in which diodes are connected to semiconductor switches such as IGBT and the like in parallel can produce the effect of the present invention.

In the present invention, a switch, which prevents an electric current from flowing in a forward direction when the switches are off but conducts in a backward direction, is called an inverse-conductive type semiconductor switch. Its examples are the power MOSFET, the inverse-conductive type GTO thyristor, and the unit in which the diodes are connected to the semiconductor switches such as IGBT and the like in parallel.

A gate signal is supplied to the power MOSFET switches G1 to G4 from a control device 7 shown in FIG. 1. A pair of the switches G1 and G2 are selected "in a cross state" so that a direction of the electric current is a forward direction, and when a pair of the switches G3 and G4 are selected, the direction of the electric current is the backward direction. This is necessary for enabling a flow of a magnetization reset current for improving an exciting property of a current transformer for pulse operation of a compact medical accelerator bending magnet.

In FIG. 1, a low-voltage large-current power supply 5 is inserted between an inductive load 6 and the switch 2, and when its voltage is applied to a discharge current in series, energy can be replenished at every discharge. Further, at the first time, the low-voltage large-current power supply 5 allows an electric current 4 in the circuit, and by cutting off the electric current 4 by the current switch 2, the capacitor 1 can be charged like a snubber capacitor, and thus a pulse current for high-speed boot can be obtained only by the low-voltage power supply without preparing a separate high-voltage power supply for charging the capacitor. Needless to say, a general method of connecting a charging power supply to the capacitor 1 so as to charge the capacitor is effective.

INDUSTRIAL APPLICABILITY

Figure 5:
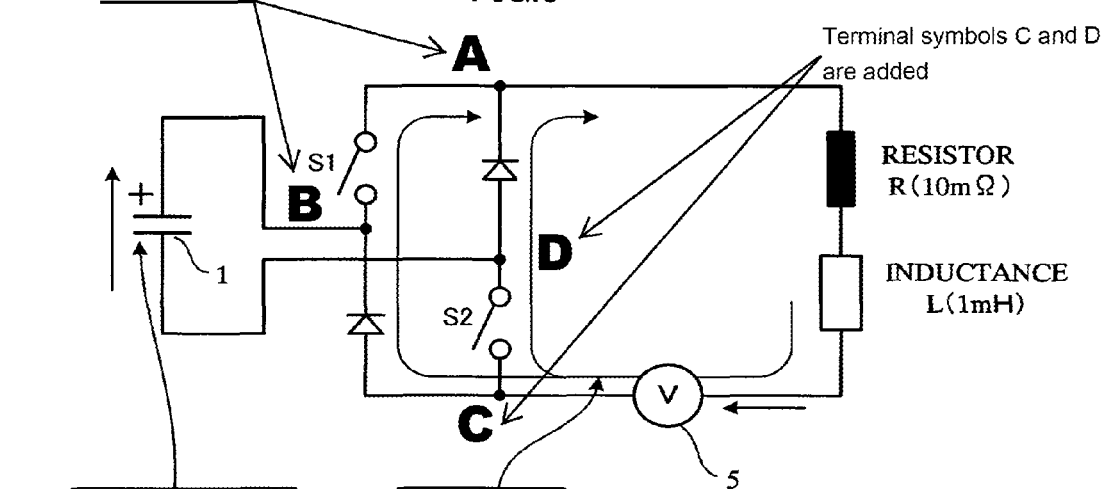
FIG. 5 is a model diagram of a calculator simulation for analyzing a basic principle of a method of supporting a capacitor voltage, and a simulation waveform of a load current and the capacitor voltage of the present invention.
Figure 5:
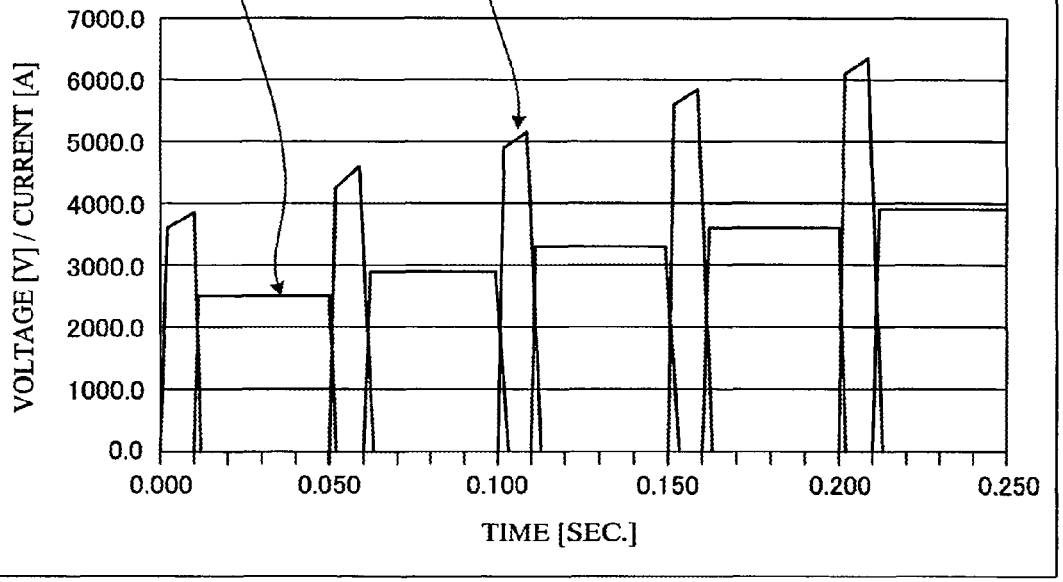

According to the present invention, the gate signals of bidirectional current switches having a bridge constitution composed of four semiconductor switches connected to diodes in parallel as the switch of the energy source capacitor for generating an electric current are controlled, so that the electric current to the inductive load can be started, maintained and stopped at a high speed. At this time, when the electric current is reduced, the magnetic energy is regenerated with the same polarity as that of the capacitor. As shown in FIG. 5, when the low-voltage large-current power supply 5 is inserted into the current circuit, the charging voltage of the capacitor can be increased or decreased while a discharge cycle is being repeated.

When the two power MOSFETs in series have the withstand voltage, a total capacity of the four switch elements may be basically half, and further when it is considered that a pulse conductive current flows in two arms in parallel, the total capacity is half. For this reason, the present invention can be applied basically without increasing voltage-current capacity in comparison with conventional pulse power supply.

The invention claimed is:

1. A high repetitious pulse generation and energy recovery system comprising:

a bridge circuit including a first switch connected at one side to a cathode of a first diode at a first bridge circuit contact point (B), a second switch connected at one side to an anode of a second diode at a second bridge circuit contact point (D), a first bridge circuit terminal point (A) connecting the other side of the first switch and a cathode of the second diode, and a second bridge circuit terminal point (D) connecting the other side of the second switch and an anode of the first diode, wherein both of the first and the second diodes allow electric current to flow from the second bridge circuit terminal point (C) to the first bridge circuit terminal point (A) when the first and the second switches are both on;

a capacitor capable of holding electric charge connected between the first and the second contact points (B, D) of the bridge circuit;

an inductive load operatively coupled to the first and the second bridge circuit terminal points (A, C); and a control circuit for controlling the first and the second switches to turn on and off simultaneously;

wherein the control circuit controls the first and the second switches to turn on for supplying a pulse electric current through the first switch to the first bridge circuit terminal point (B) at least for the duration of the time required to fully discharge the capacitor, wherein the electric current passes through both of the first and the second switches, through both of the first and the second diodes, and through the inductive load, whereby the diodes enter into a freewheeling state, and wherein the control circuit further controls the first and the second switches to turn off, thereby terminates the freewheeling state and restores the electric charge to the capacitor by recycling the discharged electric current from the inductive load through the first diode, whereby the system supplies a series of current pulses that are generated at least once per a second to the inductive load and recovers residual magnetic energy from the inductive load by recharging the capacitor so as to use the charge for a next discharge of the capacitor.

2. A high repetitious pulse generation and energy recovery system according to claim 1, wherein the capacitor is charged with initial electric charge and the inductive load is driven only by energy obtained by the initial electric charge.

3. A high repetitious pulse generation and energy recovery system according to claim 2, further comprising third and fourth switches connected in parallel with the first and the second diodes respectively, wherein the third and the forth switches that constitute a second switching group are turned off and on simultaneously when the first and the second switches that constitute a first switching group are turned on and off, thereby the first switching group and the second switching group turns on and off in opposite state.

4. A high repetitious pulse generation and energy recovery system according to claim 3, further comprising third and fourth diodes connected in parallel with the first and second switches respectively, wherein the third diode is connected with its anode to the first bridge circuit terminal point (A) and a cathode to the first bridge circuit contact point (B), and the fourth diode is connected with its anode to the second bridge circuit contact point (D) and a cathode to the second bridge circuit terminal point (C).

5. A high repetitious pulse generation and energy recovery system according to claim 4, wherein the first, the second, the third and the fourth switches and corresponding the third, the fourth, the first and the second diodes connected in parallel form four sets of the inverse-conductive semiconductor switches, and wherein the bridge circuit allows electric current to flow in a series of bidirectional current pulses to the inductive load and recovers residual magnetic energy of the inductive load in both directions by selectively turn on one of the first and the second switching groups to discharge the electric current from the capacitor.

6. A high repetitious pulse generation and energy recovery system according to claim 5, wherein the inverse-conductive semiconductor switches include at least one device selected from the following: power MOSFETs, inverse-conductive GTO thyristors, and IGBTs.

7. A high repetitious pulse generation and energy recovery system according to claim 1, further comprising a power supply for providing direct current for replenishing consumed energy so as to increase or decrease a next discharge current.

8. A high repetitious pulse generation and energy recovery system according to claim 7, wherein the energy supplied by the power supply to the capacitor creates a larger current output pulse compared with a pulse generated in a previous cycle by repeating the energy recovering cycle.

9. A high repetitious pulse generation and energy recovery system according to claim 8, further comprising third and fourth switches connected in parallel with the first and second diodes respectively, wherein the third and the forth switches that constitute a second switching group are turned off and on simultaneously when the first and the second switches that constitute a first switching group are turned on and off, thereby the first switching group and the second switching group turns on and off in opposite state.

10. A high repetitious pulse generation and energy recovery system according to claim 9, further comprising third and fourth diodes connected in parallel with the first and the second switches respectively, wherein the third diode is connected with its anode to the first bridge circuit terminal point (A) and a cathode to the first bridge circuit contact point (B), and the fourth diode is connected with its anode to the second bridge circuit contact point (D) and a cathode to the second bridge circuit terminal point (C).

11. A high repetitious pulse generation and energy recovery system according to claim 10, wherein the first, the second, the third and the fourth switches and corresponding the third, the fourth, the first and the second diodes connected in parallel form four sets of the inverse-conductive semiconductor switches, and wherein the bridge circuit allows electric current to flow in a series of bidirectional current pulses to the inductive load and recovers residual magnetic energy of the inductive load in both directions by selectively turn on one of the first and the second switching groups to discharge the electric current from the capacitor.

12. A high repetitious pulse generation and energy recovery system according to claim 11, wherein the inverse-conductive semiconductor switches include at least one device selected from the following: power MOSFETs, inverse-conductive GTO thyristors, and IGBTs.

13. A high repetitious pulse generation and energy recovery system according to claim 12, wherein the inductance load includes a pulse high-magnetic field bending magnet in a medical synchrotron accelerator.

14. A high repetitious pulse generation and energy recovery system comprising;

an inductive load;

a pulse power supply device for supplying a bipolar pulse current to the inductive load with high repetition and recovering residual magnetic energy of a system so as to use it for successive discharges;

a bridge circuit including a first pair of two inverse-conductive semiconductor switches that do not have direct connection with each other and a second pair of two inverse-conductive semiconductor that do not have direct connection with each other, the bridge circuit having a pair of DC terminal points (B, D) and a pair of AC terminal points (A, C), composed of the four inverse-conductive semiconductor switches, wherein the inductive load is connected to the AC terminal points (A, C);

a capacitor connected to the DC terminal points (B, D) of the bridge circuit; and a control circuit for controlling the first and second pairs of inverse-conductive semiconductor switches so that when the inverse-conductive semiconductor switches in the first pair are controlled to turn on simultaneously, the control circuit controls the two inverse-conductive semiconductor switches in the second pair to be off simultaneously, and so that when the two inverse-conductive semiconductor switches in the second pair are controlled to turn on simultaneously, the control circuit controls the two inverse-conductive semiconductor switches in the first pair to be off simultaneously;

wherein the control circuit controls the first pair of inverse-conductive semiconductor switches to turn on for supplying a pulse current through the one of the first pair of inverse-conductive semiconductor switches to one of the AC terminal points of the bridge switch circuit at least for the duration that the charge stored in the capacitor is fully discharged and the electric current flows to both pairs of inverse-conductive semiconductor switches through the inductive load to enter into a freewheeling state, and wherein the control circuit further controls the first pair of inverse-conductive semiconductor switches to turn off for terminating the freewheeling state and restoring the electric charge to the capacitor by recycling the discharged electric current through one of the second pair of inverse-conductive semiconductor switches, thereby the system supplies a series of current pulses that are generated more than once per a second to the inductive load and recovers residual magnetic energy of the inductive load so as to use it for the next discharge of the capacitor.

15. A high repetitious pulse generation and energy recovery system according to claim 14, wherein a power supply for providing direct current is inserted therein for replenishing consumed energy.

16. A high repetitious pulse generation and energy recovery system according to claim 15, the power supply is inserted in series with the inductive load and the bridge circuit.

17. A high repetitious pulse generation and energy recovery system according to claim 16, wherein the bridge circuit generates a bipolar pulse current through one of the AC terminal points (A, C) to the inductive load by alternating a selection of the first and second pair of inverse-conductive semiconductor switches.

18. A high repetitious pulse generation and energy recovery system according to claim 17, wherein the inverse-conductive semiconductor switches are selected from at least one of the following: power MOSFETs, inverse-conductive GTO thyristors, and IGBTs.

19. A high repetitious pulse generation and energy recovery system comprising:

a bridge circuit including a first switch whose terminals are connected with cathodes of a first and a second diodes and a second switch whose terminals are connected with anodes of the two diodes, wherein electric current flows the switches and the diodes when the first and the second switches are both on;

a capacitor capable of holding electric charge connected between first and second contact points of the bridge circuit (B, D) where one end of the first switch and cathode of the first diode are connected and one end of the second switch and anode of the second diode are connected respectively;

an inductive load operatively coupled to first and second bridge circuit terminal points (A, C) where the other end of the first switch and cathode of the second diode are connected and the other end of the second switch are anode of the first diode are connected respectively; and a control circuit for controlling the switches at least once per a second; wherein the control circuit controls the first and second switches to turn on simultaneously for supplying a pulse electric current through the first switch to the first bridge circuit terminal point (A) at least for the duration of the time required to fully discharge the capacitor, wherein the electric current passes through both of the first and second switches, and through the inductive load, and wherein the control circuit further controls the switches to turn off, thereby restoring the electric charge to the capacitor by recycling the discharged electric current from the inductive load, whereby the system supplies a series of high frequency current pulses to the inductive load and recovers residual magnetic energy from the inductive load by recharging the capacitor so as to use the charge for a next discharge of the capacitor.

* * * * *